United States Patent
Yamauchi et al.

(10) Patent No.: US 6,825,915 B2
(45) Date of Patent: Nov. 30, 2004

(54) ALIGNMENT DEVICE

(75) Inventors: Akira Yamauchi, Shiga (JP);
Yoshiyuki Arai, Shiga (JP); Chisa Inaka, Shiga (JP); Eiji Shamoto, Hyogo (JP); Toshimichi Moriwaki, Hyogo (JP)

(73) Assignee: Toray Engeneering Co., Ltd., Osaka (JP)

( * ) Notice: Subject to any disclaimer, the term of this patent is extended or adjusted under 35 U.S.C. 154(b) by 0 days.

(21) Appl. No.: 10/362,461

(22) PCT Filed: Aug. 21, 2001

(86) PCT No.: PCT/JP01/07167
§ 371 (c)(1),
(2), (4) Date: Feb. 25, 2003

(87) PCT Pub. No.: WO02/07382
PCT Pub. Date: Feb. 28, 2002

(65) Prior Publication Data
US 2003/0179353 A1 Sep. 25, 2003

(30) Foreign Application Priority Data
Aug. 25, 2000 (JP) ........................................ 2000-255773

(51) Int. Cl.[7] .......................... G03B 27/42; G01B 11/00; B23Q 1/25; H04L 41/04
(52) U.S. Cl. ........................... 355/72; 355/53; 356/400; 356/401; 269/71; 310/311
(58) Field of Search .......................... 156/285, 60, 349, 156/358; 310/311; 355/53, 72; 356/399, 400, 401; 289/71; 318/649

(56) References Cited

U.S. PATENT DOCUMENTS 5,280,677 A * 1/1994 Kubo et al. .................... 33/568
5,438,419 A * 8/1995 Lee et al. .................... 356/399
5,568,032 A * 10/1996 Wakui .......................... 318/632
5,894,056 A * 4/1999 Kakizaki et al. ................ 430/5
6,309,505 B1 * 10/2001 Takisawa et al. ........... 156/285
6,327,026 B1 * 12/2001 Wakui .......................... 355/72

FOREIGN PATENT DOCUMENTS

| EP | 0 865 073 A2 | * | 3/1996 |
| JP | 60-214361 | * | 10/1985 |
| JP | 62-192809 A | | 8/1987 |
| JP | 04-003909 | * | 1/1992 |
| JP | 6-291173 A | | 10/1994 |

* cited by examiner

Primary Examiner—Alan Mathews
(74) Attorney, Agent, or Firm—Smith Patent Office (57) ABSTRACT

An alignment device comprising a movable table, a plurality of movable support means for movably supporting the movable table, means for reading a recognition mark, and a control means for controlling the drive of the movable support means based on information from the recognition means, wherein each movable support means comprises means having a pair of support blocks each provided to be able to contact/separate with/from the movable table and a pair of piezoelectric actuators each provided with expansible first, second and third piezoelectric elements connected to a support block and extending in each direction, and being capable of walking operation relative to the movable table by the operations of the respective piezoelectric actuators. An alignment accuracy up to a nanometer level can be attained, and the alignment device itself and therefore the entire apparatus incorporating the alignment device can be significantly reduced in thickness and size.

24 Claims, 5 Drawing Sheets

ALIGNMENT DEVICE

TECHNICAL FIELD OF THE INVENTION

The present invention relates to an alignment device which can position an object to be positioned at a high accuracy within a target accuracy, and specifically to a device suitable for alignment in an apparatus such as a mounting apparatus or an exposure apparatus for wafers, etc.

BACKGROUND ART OF THE INVENTION

For example, in a mounting apparatus for bonding wafers to each other, an aligner for positioning a wafer at a predetermined position in order to processing the wafer or mounting a chip or other parts on the wafer, or an exposure apparatus for performing a predetermined exposure on a wafer, it is necessary to position the wafer at a predetermined position with a high accuracy. As a conventional alignment device used for such positioning of an object to be positioned, for example, used is a device wherein tables adjustable in position in X-axis and Y-axis directions (a horizontal direction) and θ direction (a rotational direction) are stacked and as needed a table or a head adjustable in position in Z-axis direction (a vertical direction) is combined, and in such a device, the positioning accuracy is increased by adjusting and controlling the respective positions in the respective axes directions and the rotational direction.

In such a conventional alignment device, however, because the adjustment is carried out in order with respect to the respective directions (for example, X-axis and Y-axis directions and θ direction), even if a relatively high-accuracy positioning becomes possible only in one direction, there is a case where the positioning accuracy in the direction already adjusted goes wrong when the positioning in the other directions is performed, and consequently, the final positioning accuracy is limited. Further, since usually a mechanical guide is used for positioning, there is a limit in the accuracy of the guide, and also from this point of view, the final positioning accuracy is limited. More concretely, in a conventional alignment device, the possible positioning accuracy is an accuracy which cannot expect a submicron-level positioning, and therefore, a several-ten nanometer-level or several nanometer-level positioning is impossible by the conventional possible positioning accuracy.

Further, as aforementioned, since a conventional alignment device is constructed by stacking tables adjustable in position in X-axis and Y-axis directions and θ direction, when an axis A except an uppermost axis is adjusted, an axis stacked above the axis A must be driven, and therefore, the efficiency of the drive and control for positioning is not good. Moreover, when the device is constructed by stacking tables adjustable in position in X-axis and Y-axis directions and θ direction, the thickness (the size in the vertical direction) of the entire alignment device increases, and therefore, an apparatus incorporating this alignment device, for example, a mounting apparatus or an exposure apparatus, inevitably becomes large-sized. Further, because the distance from a guide to an uppermost positioning surface becomes large, an error of the guide is amplified, and this may give a bad influence to the positioning accuracy.

Furthermore, since the positioning in θ direction is performed by adjusting a position adjusting table around a predetermined center axis, when the size of an object to be positioned, for example, a wafer, is large, particularly the alignment accuracy in the θ direction deteriorates at a radially outer position in proportion to the radius of the wafer.

DISCLOSURE OF THE INVENTION

Accordingly, a purpose of the present invention is to provide an alignment device which is constructed not by stacking position adjusting tables for the respective directions and the rotational direction as in a conventional device, but by enabling to adjust a single movable table holding an object to be positioned in a single plane simultaneously in at least X-axis and Y-axis directions and θ direction, thereby enabling to position the object to a target position at a time only by a specified one-kind position adjusting means, which can perform a high-accuracy positioning in each direction and up to a radially outer portion of the object, the efficiency of the positioning operation of which is good, and which can construct the entire apparatus to be compact.

To achieve the above-described purpose, an alignment device according to the present invention comprises a movable table for holding an object to be positioned, a plurality of movable support means for movably supporting the movable table at a plurality of positions, respectively, means for reading a recognition mark provided on the object or the movable table, and a control means for controlling the drive of the movable support means based on information from the recognition means, and positioning the object within a target accuracy by the control of the control means, wherein each movable support means comprises means having a pair of support blocks each provided to be able to contact/separate with/from the movable table and a pair of piezoelectric actuators each provided with expansible first and second piezoelectric elements extending in a substantially horizontal direction across each other and an expansible third piezoelectric element extending in a substantially vertical direction, the first, second and third piezoelectric elements being connected to a support block, and being capable of walking operation relative to the movable table by the operations that the pair of piezoelectric actuators contact/separate the pair of support blocks with/from the movable table alternately.

Namely, in the above-described alignment device, in each piezoelectric actuator of each movable support means, the support block is brought into contact with or separated from the movable table by the expansion and contraction operation (hereinafter, merely referred to as expansion operation in this specification) of the third piezoelectric element, and the support block is moved in the two-dimensional direction, that is the horizontal direction, by the expansion operations of the first and second piezoelectric elements, and accompanying with the movement, the third piezoelectric element is swung. The third piezoelectric element is repeatedly brought into contact with and separated from the movable table via the support block, accompanying therewith the swing operation is repeated, and by the condition where this operation is performed for each piezoelectric actuator of the pair of piezoelectric actuators alternately, two third piezoelectric elements operate as if they were in a walking motion relative to the movable table, and this motion is exhibited as the walking operation. This walking operation is a relative operation to the movable table, and actually, the movable table side is moved by driving the plurality of movable support means. By controlling the drive of the plurality of movable support means, the movable table can be adjusted in position in a single plane simultaneously in X-axis and Y-axis directions (horizontal direction) and θ direction (rotational direction), and besides, the position of the rotational center can also be controlled arbitrarily, and therefore, the object can be moved to a target position with a high accuracy at a time by the specified movable support means using piezoelectric elements.

In this positioning, because basically it is not necessary to have a mechanical guide structure, the positioning accuracy is not limited originating from the mechanical guide structure. Further, because the movable table can be driven in a single plane simultaneously in X-axis, Y-axis and θ directions by the drive of the plurality of movable support means, the distance up to the positioning surface on the movable table or on the object held on the movable table may be small from the viewpoint of this drive system due to the plurality of movable support means, and therefore, there does not occur a problem of amplification of an control error in the drive of the positioning surface ascribed to this distance, which has occurred in a case where the distance from a drive surface to a positioning surface becomes relatively large such as a case of a conventional device. Therefore, a high accuracy for positioning can be ensured. Namely, since an efficient and high-accuracy positioning can be performed at a time by the plurality of movable support means without using a mechanical guide structure, an error ascribed to the drive for positioning hardly occurs, and a high-accuracy positioning becomes possible. Further, since the drive plane in X-axis, Y-axis and θ directions by the plurality of movable support means becomes substantially a single plane, the drive efficiency for positioning is good. Furthermore, because the plurality of movable support means form one set of positioning means disposed substantially on a single plane, the alignment device can be reduced in size particularly in the vertical direction, as compared with a case where position adjusting tables for the respective axes directions and the rotational direction are stacked such as a case of a conventional device.

Further, since piezoelectric elements capable of controlling the expansion amounts with a high accuracy are used for the control of the movement of the movable table by the plurality of movable support means, namely, since piezoelectric elements each having an extremely high resolution are used (at present, although the resolution of a piezoelectric element itself is less than an angstrom level, the resolution of a measurement/control system including a piezoelectric element and various equipment is about 12 nm, and it is possible to further improve the resolution to a level less than 5 nm by changing the control structure), a significantly high-accuracy positioning becomes possible. Further, even if the size of an object to be positioned becomes large, because the respective movable support means can be disposed at positions corresponding to the radially outer portions of the object, the resolution particularly in θ direction can be maintained to be high.

Moreover, since the alignment device according to the present invention basically does not have a slide part, it can be installed in a vacuum chamber and the like in which it is difficult to dispose a conventional device having a slide part. Further, as described above, because the alignment device can be constructed as a type thin in the vertical direction, it becomes possible to form an opening structure at the central portion and to provide a recognition means for alignment (for example, a camera for alignment) or provide a backup member for a case accompanying pressing operation at the central-opening position or a position corresponding thereto.

Further, in the present invention, it is possible to omit the movable table and support an object to be positioned directly by the movable support means. Namely, an alignment device according to the present invention can comprises a plurality of movable support means for movably supporting an object to be positioned at a plurality of positions, respectively, means for reading a recognition mark provided on the object, and a control means for controlling the drive of the object based on information from the recognition means, and positioning the object within a target accuracy by the control of the control means, wherein each movable support means comprises means having a pair of support blocks each provided to be able to contact/separate with/from the object and a pair of piezoelectric actuators each provided with expansible first and second piezoelectric elements extending in a substantially horizontal direction across each other and an expansible third piezoelectric element extending in a substantially vertical direction, the first, second and third piezoelectric elements being connected to a support block, and being capable of walking operation relative to the object by the operations that the pair of piezoelectric actuators contact/separate the pair of support blocks with/from the object alternately.

The above-described alignment device according to the present invention may be constructed so that the coarse positioning of the object is carried out by the walking operation, and the precise positioning of the object is carried out by the expansion operations of the respective piezoelectric elements at a condition where the walking operation is stopped. Since the amount of expansion of each piezoelectric element can be controlled at a significantly high accuracy although the amount itself cannot be increased so much, it is possible to perform the positioning at a submicron level, which has been impossible in the conventional technology, and further at a nanometer level, by such a high-accuracy adjustment after the coarse adjustment due to the walking operation.

It is preferred to perform the above-described precise positioning of the object within a range of one step of the walking operation. By this, the high-accuracy fine adjustment utilizing the expansion operations themselves of the piezoelectric elements after the above-described coarse adjustment can be carried out more surely. Further, it is preferred that the swing position of the third piezoelectric element due to the expansion operations of the first and second piezoelectric elements is reset to a center position in a range of one step of the walking operation before the precise positioning of the object. By this, the high-accuracy fine adjustment utilizing the expansion operations themselves of the piezoelectric elements after the above-described coarse adjustment can be carried out in an arbitrary direction.

Further, a piezoelectric element has a property liable to be influenced by its history that the following drive amount and locus are likely to be decided by the previous drive stroke. Therefore, in order to remove an bad influence due to this property for the positioning accuracy, resetting is preferred before the precise positioning of the object so as not exhibit the influence due to the histories of the previous operations. Namely, it is preferred that the histories of the amounts of the expansion operations of the respective piezoelectric elements are reset before the precise positioning of the object.

Further, it is preferred that the properties of the expansion operations of the above-described respective piezoelectric elements are calibrated beforehand. By this, the accuracy for the control by the control means can be ensured. Although the timing of the calibration may be appropriately set, in a case where a variation of the properties of the expansion operations of the piezoelectric elements is expected, it is preferred to carry out the calibration regularly although a high frequency for the calibration is not necessary, and in that case, the calibration value is preferably renewed to the newest one.

Such an alignment device according to the present invention is suitable particularly for an apparatus requiring a high-accuracy positioning. For example, the alignment device is incorporated into a mounting apparatus for bonding wafers to each other, a wafer and a chip, or chips to each other, and the device can be used for positioning of an object to be bonded in the mounting apparatus. Further, the alignment device can be used as an aligner for positioning a wafer, etc. in order to mount a chip and other parts thereonto. Furthermore, the alignment device can be used for positioning of an object to be exposed in an exposure apparatus in order to give a predetermined exposure to a wafer, etc.

THE BEST MODE FOR CARRYING OUT THE INVENTION

Hereinafter, desirable embodiments of the present invention will be explained referring to figures.

Figure 1:
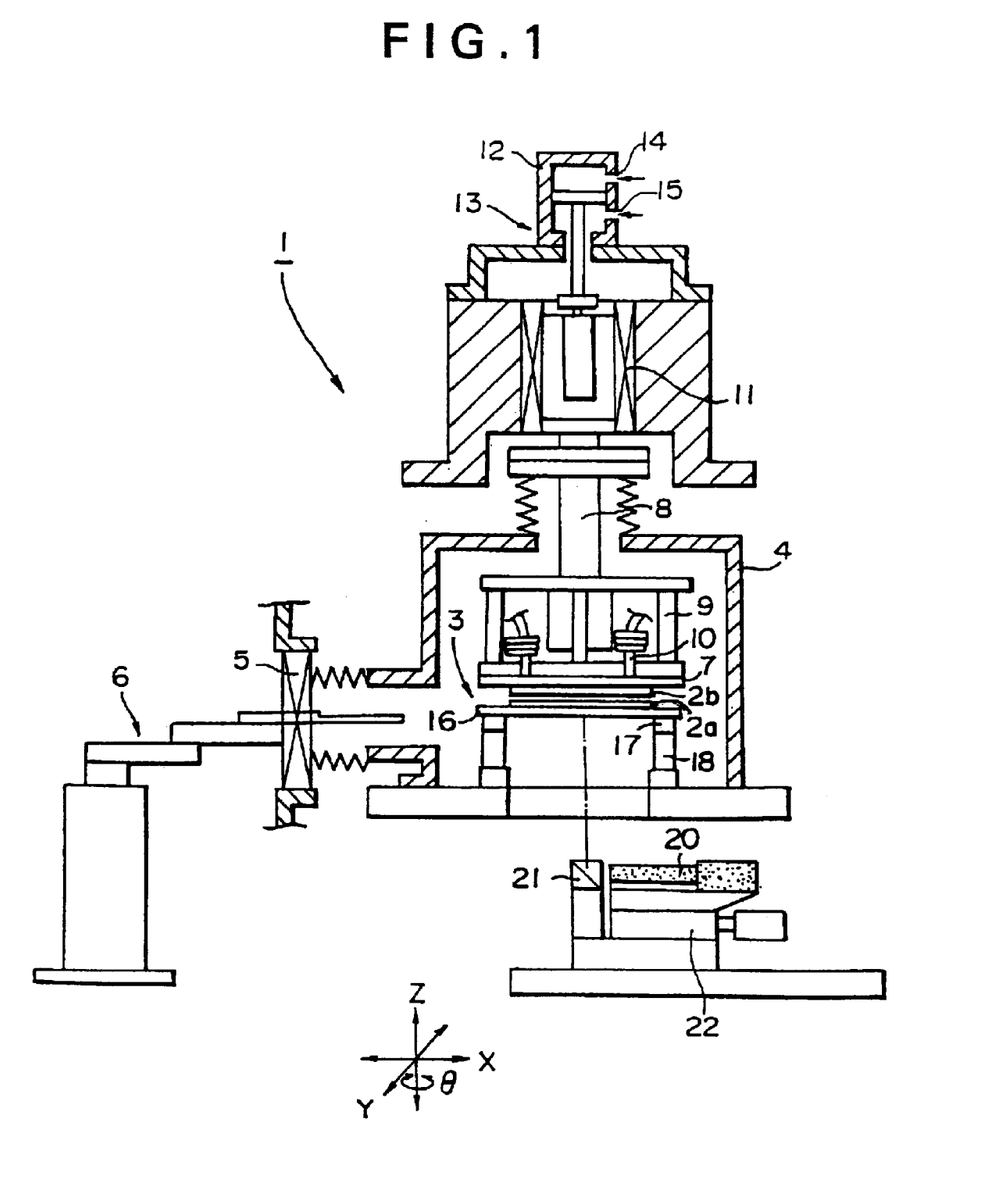
FIG. 1 is a schematic view of a mounting apparatus incorporated with an alignment device according to an embodiment of the present invention.

FIG. 1 shows a mounting apparatus for bonding wafers to each other which is incorporated with an alignment device according to an embodiment of the present invention. Mounting apparatus 1 bonds a wafer 2a and a wafer 2b prepared as object to be bonded to each other, and in this embodiment, an alignment device 3 according to the present invention is incorporated for positioning the wafer 2a provided as an object to be positioned.

Although the bonding of wafer 2a and wafer 2b is carried out in a bonding chamber 4 in this embodiment, the chamber 4 may be provided as needed. In this embodiment, a gate 5 capable of being opened/closed is provided to bonding chamber 4, and at a condition where the gate 5 is opened, wafers 2a and 2b as objects to be bonded to each other are introduced into the bonding chamber 4 by a robot 6 provided as a conveying means.

In the bonding part for bonding the objects to each other, means for directly holding the upper-side wafer 2b is constructed from an electrostatic chuck 7 in this embodiment, and the electrostatic chuck 7 is attached to the lower end of a head 8 capable of being moved vertically. A plurality of support poles 9 capable of controlled in expansion are disposed on the lower portion of head 8. By controlling the amounts of expansions of the respective support poles 9, the parallelism of electrostatic chuck 7, ultimately, the parallelism of upper-side wafer 2b relative to lower-side wafer 2a, can be adjusted. A piezoelectric element can be used for controlling the expansion of each support pole 9.

Further, light guides 10 each for guiding a light irradiated toward an infrared-ray camera described later are provided on the lower portion of head 8. Each light guide 10 irradiates a light guided from a light source (not shown) via optical fibers and the like, toward a vertically downward direction. A portion of electrostatic chuck 7, through which the light from light guide 10 is transmitted, is constructed of a transparent material capable of transmitting the light, or is provided with a hole for transmitting the light.

A vertical movement mechanism 11 is provided above head 8, and thereabove, a pressing means 13 having a pressing cylinder 12 such as an air cylinder is provided. A pressing port 14 for controlling the pressing force in the downward direction and a balance port 15 for controlling the pressing force and generating a movement force in the upward direction are provided on pressing cylinder 12. Vertical movement mechanism 11 moves upper-side wafer 2b held on electrostatic chuck 7 downwardly, and after the movement and the adjustment of the parallelism, it can bring the upper-side wafer 2b into contact with lower-side wafer 2a and can temporarily bond the wafer 2b to the wafer 2a. Further, pressing means 13 can apply a pressing force via vertical movement mechanism 11 at the time of the temporary bonding, and after the temporary bonding, it can further press the moved-down upper-side wafer 2b onto the lower-side wafer 2a, thereby performing a final bonding by the pressing.

In this embodiment, alignment device 3 according to the present invention is provided for the positioning of lower-side wafer 2a. Alignment device 3 comprises a movable table 16 constructed of a transparent material for holding wafer 2a provided as an object to be positioned, and a plurality of movable support means 17 for movably supporting the movable table 16 at a plurality of positions, respectively, (in this embodiment, at three positions in the circumferential direction of the movable table 16). Each movable support means 17 is provided on each support stand 18 vertically extending and provided in correspondence with each movable support means 17, and movable table 16 is supported on the respective movable support means 17. In this embodiment, as described later, because an infrared-ray camera is provided below as a recognition means, movable table 16 is formed from a transparent material (for example, a glass plate) so that the lights from the aforementioned light guides 10 can reach the infrared-ray camera, but it is possible to employ a structure wherein a hole for transmitting the lights is opened at a central portion, etc. The above-described respective support stands 18 may be constructed as stands capable of being adjusted in position (in height) in the vertical direction (in Z direction). Although electrostatic chuck 7 is provided only for upper-side wafer 2b in this embodiment, as needed, for example, an annular electrostatic chuck having a hole at the central portion, preferably, an electrostatic chuck made of a transparent material, may be provided also for lower-side wafer 2a.

In this embodiment, an infrared-ray camera 20 is provided as a recognition means at a position below movable table 16 and outside of bonding chamber 4. Infrared-ray camera 20 can read the recognition marks for alignment provided on upper-side wafer 2b or electrostatic chuck 7 and the recognition marks provided on lower-side wafer 2a or movable table 16, respectively, via a prism device 21 and using the lights irradiated from light guides 10. The positions of these infrared-ray camera 20 and prism device 21 can be adjusted and controlled by a position adjusting means 22.

Figure 2:
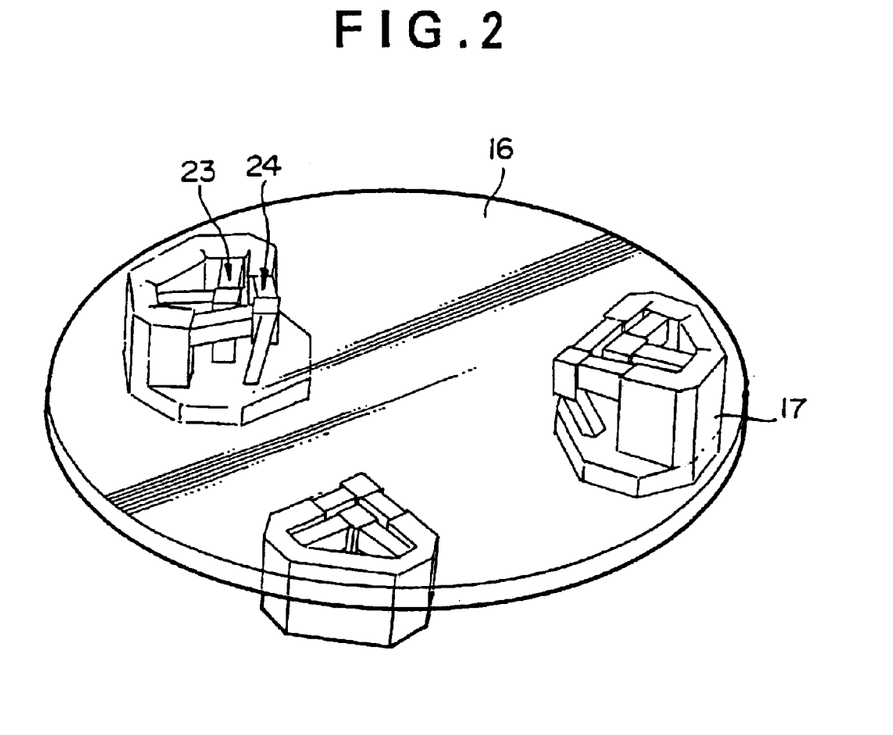
FIG. 2 is an enlarged perspective view of the alignment device portion in the apparatus depicted in FIG. 1.
Figure 3:
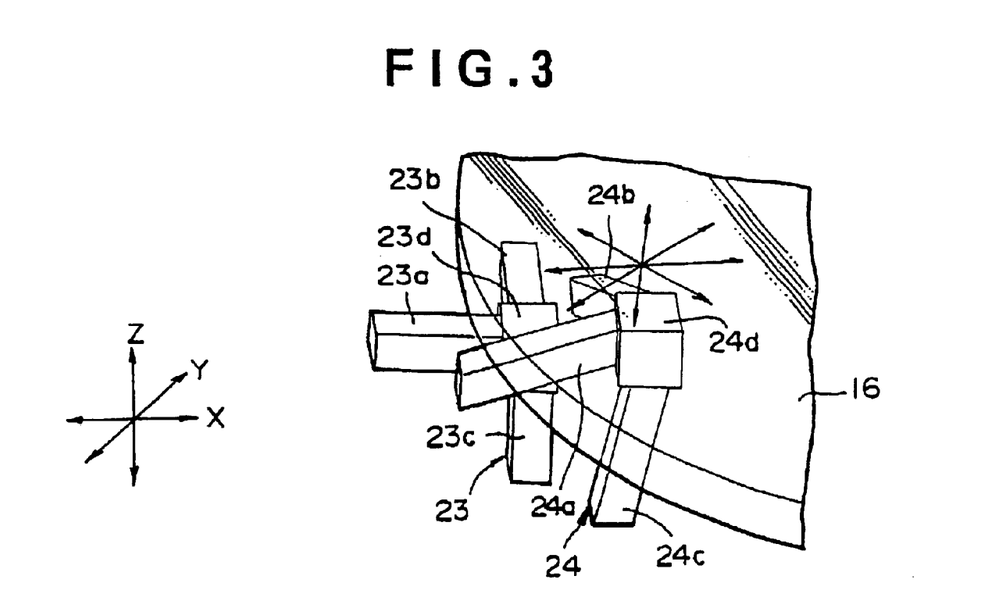
FIG. 3 is an enlarged perspective view of a piezoelectric actuator portion in the device depicted in FIG. 2.

Alignment device 3 is constructed as shown in FIGS. 2 and 3. In this embodiment, as shown in FIG. 2, three movable support means 17 are provided at three positions in the circumferential direction of the disc-like movable table 16. In each movable support means 17, a pair of piezoelectric actuators 23 and 24 are provided. As shown in FIG. 3, piezoelectric actuators 23 and 24 are equipped with support blocks 23d and 24d each provided at a condition capable being contacted/separated with/from movable table 16, first piezoelectric elements 23a and 24a and second piezoelectric elements 23b and 24b connected to the support blocks 23d and 24d and extending in a substantially horizontal direction across each other (extending in X and Y directions), and third piezoelectric elements 23c and 24c connected to the support blocks 23d and 24d and extending in a substantially vertical direction (extending in Z direction).

By controlling the amounts of the expansions of first piezoelectric elements 23a and 24a and second piezoelectric elements 23b and 24b, support blocks 23d and 24d connected thereto can be moved in the surface direction of movable table 16, namely, in arbitrarily all directions in a substantially horizontal direction, as shown by arrows in FIG. 3. Therefore, when support block 23d or 24d is brought into contact with the lower surface of movable table 16 and the contact support block is moved, the movable table 16 can be moved in the movement direction of the support block accompanying with the movement of the support block. At that time, third piezoelectric element 23c or 24c is swung accompanying with the movement of the support block, and it supports the support block and movable table 16 via the support block from the lower direction. By contacting/separating support blocks 23d and 24d with/from movable table 16 alternately, moving the support blocks 23d and 24d and swinging third piezoelectric elements 23c and 24c, the third piezoelectric elements 23c and 24c of piezoelectric actuators 23 and 24 and the support blocks 23d and 24d perform the walking operation relative to the movable table 16. Since the respective movable support means 17 are provided on the respective corresponding support stands 18, by the above-described walking operation, actually movable table 16 is moved by the amount of the walking operation.

Figure 4A:
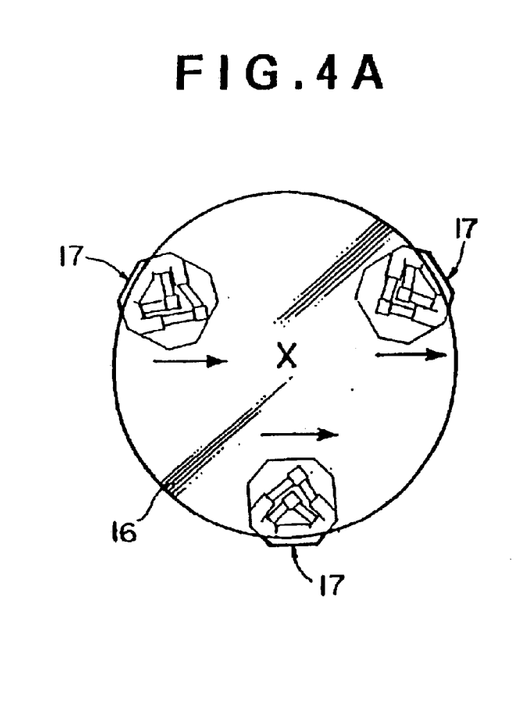
FIGS. 4A to 4C are plan views of the device depicted in FIG. 2, showing examples of the respective operations.
Figure 4B:
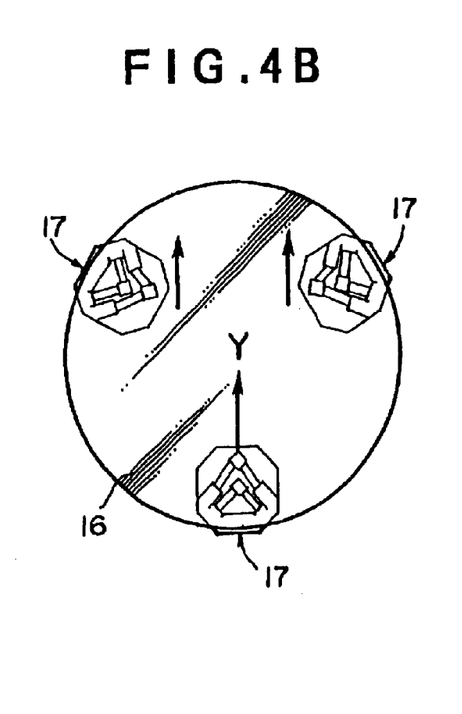
Figure 4C:
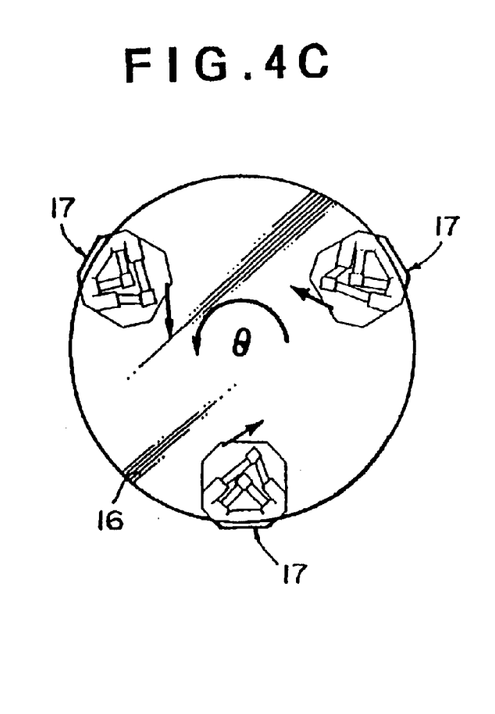

Since three movable support means 17 are provided at three positions in the circumferential direction of the disc-like movable table 16, it is possible to move the movable table 16 arbitrarily in X, Y and θ directions by driving the respective piezoelectric elements of the respective movable support means 17 synchronously, as shown in FIGS. 4A to 4C. FIG. 4A shows an example in which movable table 16 is moved in X direction by the operations of the respective piezoelectric elements of the respective movable support means 17, FIG. 4B shows an example of the movement in Y direction, and FIG. 4C shows an example of the movement in θ direction, respectively. By combining these operations, movable table 16 can be moved arbitrarily in X, Y and θ directions, and wafer 2a held on the movable table 16 can be positioned in arbitrary directions of X, Y and θ directions. Besides, at that time, the rotation center of the movement in θ direction can be brought to an arbitrary position by controlling the operations of the respective piezoelectric elements.

Thus, in alignment device 3 according to the present invention, it becomes possible to perform the position adjustment synchronously in X-axis, Y-axis and θ directions, and it is possible to position wafer 2a to a target position at a time. When the positioning is carried out, whether the wafer 2a or movable table 16 is positioned at a target position at an accuracy within a target range or not can be confirmed by reading the recognition marks with infrared-ray camera 20. If the positioning accuracy does not reach a value within the target range, the above-described positioning by the walking operation may be continued until the accuracy can reach the target accuracy. The control of such a series of operations is carried out by a control means, for example, a control means using a micro computer, into which at least the position-recognition information from infrared-ray camera 20 is input and which control the drive directions and driving amounts of the respective movable support means 17 based on the input information. Where, the recognition means for reading recognition marks is not limited to infrared-ray camera 20, and it is possible to use a usual visual-ray camera or a recognition means using a laser.

The above-described drive of the respective movable support means 17 for positioning is performed by the expansion operations of the respective piezoelectric elements, and it is known to be able to control an amount of expansion of a piezoelectric element significantly small. Therefore, an extremely high-accuracy positioning can be carried out by calibrating the expansion operations of the respective piezoelectric elements beforehand and positioning wafer based on the calibrated expansion operations of the respective piezoelectric elements. As a result, lower-side wafer 2a and upper-side wafer 2b are positioned at a high accuracy, and the bonding accuracy therebetween can be increased remarkably. With respect to the positioning in Z direction, it is also possible to finely adjust the position utilizing the expansion operations of third piezoelectric elements 23c and 24c themselves. Further, since the fine adjustment in the rotational directions around X, Y axes in addition to the positioning in Z direction can be carried out after completion of the walking operation by controlling the operations of the respective piezoelectric actuators 23 and 24, the parallelism of lower-side wafer 2a relative to upper-side wafer 2b can also be adjusted at a high accuracy.

Further, in alignment device 3 according to the present invention, as described above, because wafer 2a can be positioned in X, Y and θ directions in a same plane, it becomes unnecessary to form an alignment device by stacking respective positioning tables for the respective directions as in a conventional device, and the alignment device 3 itself can be formed as a thin type. Consequently, an apparatus incorporating this alignment device 3 may be formed small-sized. Further, since the positioning is performed in a same plane simultaneously in the respective directions, the drive for the positioning can be carried out efficiently. Furthermore, because the respective movable support means 17 are disposed on the respective peripheral portions of movable table 16, the positioning can be carried out without reducing the positioning accuracy particularly in θ direction even for a relatively large movable table 16 or wafer 2a held thereon.

A further improvement of the positioning accuracy may be possible in alignment device 3 according to the present invention. For example, since a piezoelectric element generally has a property liable to be influenced by its history that the following drive amount and locus are likely to be decided by the previous drive stroke as aforementioned, in order to remove the bad influence to the positioning accuracy ascribed to this property, it is preferred that the influence of the history of the previous operations is not exhibited. For this, resetting is preferred so as to erase the history of the previous operations before a precise positioning within a range of one step of the walking operation. Namely, it is preferred that the histories of the amounts of the expansion operations of first and second piezoelectric elements 23a, 24a, 23b and 24b in addition to third piezoelectric elements 23c and 24c are reset before the precise positioning.

In order to further improve the positioning accuracy in alignment device 3 according to the present invention, it is possible that a coarse positioning up to an accuracy within a certain-level range is carried out by the positioning by the above-described walking operation, the walking operation is basically stopped at that state, and at the condition where the walking operation is stopped, wafer 2a is precisely positioned at a further high-accuracy utilizing the expansion operations of the respective piezoelectric elements. Since this precise positioning is carried out at the condition where the walking operation is stopped, basically the positioning must be carried out within a position-adjustment range of one step of the walking operation. Further, it is preferred to reset the leg positions of the walking operation, namely, the swinging positions of third piezoelectric elements 23c and 24c based on the expansion operations of first piezoelectric elements 23a and 24a and second piezoelectric elements 23b and 24b, to a central position within a range of one step of the walking operation, in order to make the fine adjustment for the precise positioning effective for any direction. This resetting to the central position can be carried out simultaneously with the aforementioned resetting of histories.

Figure 5:
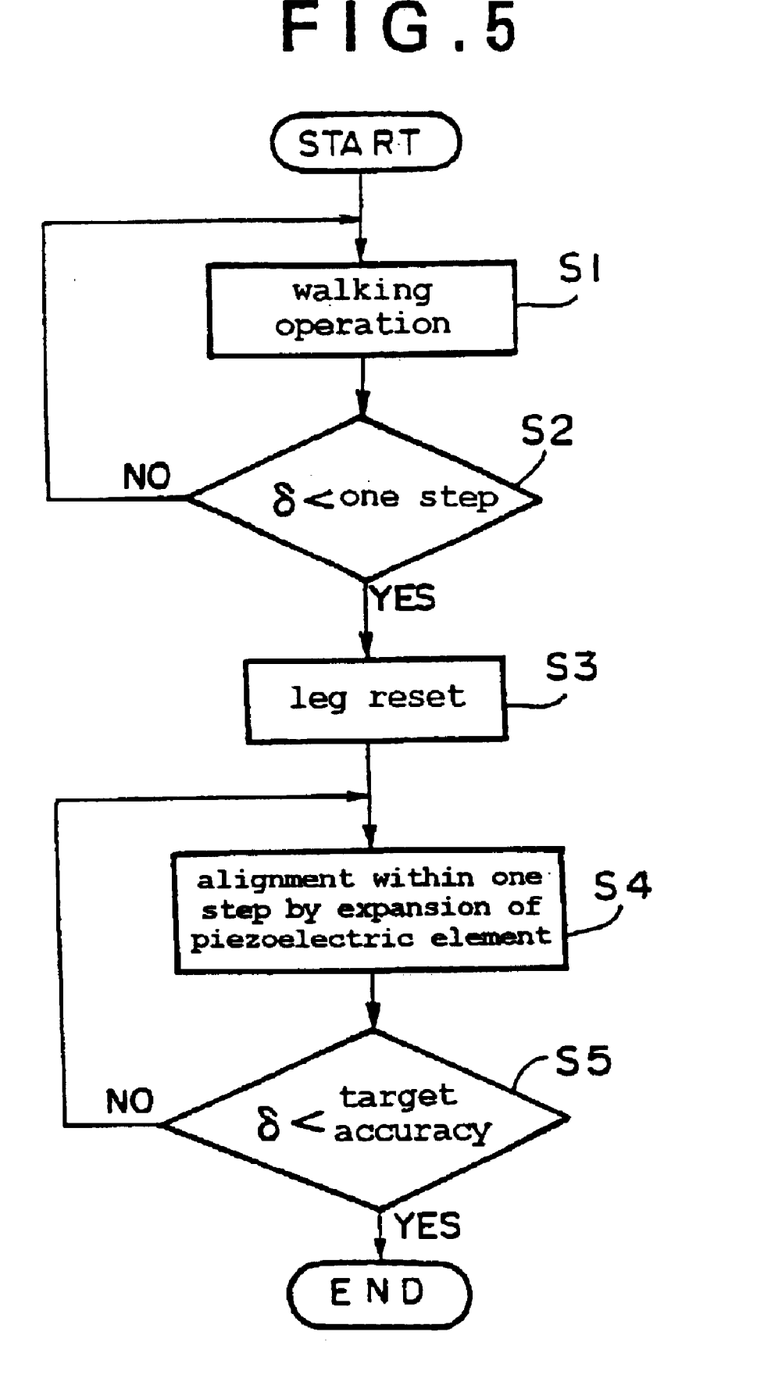
FIG. 5 is a flowchart showing an example of the control of the alignment device depicted in FIG. 2.

Such a series of controls for the precise positioning is carried out, for example, along the control flow shown in FIG. 5. In the control shown in FIG. 5, the walking operation for the above-mentioned coarse positioning is carried out at step S1, it is determined whether an error δ relative to a target position, which is determined by the recognition means, is within one step of the walking operation (step S2), and when not within one step, the flow returns to step S1 and the walking operation is continued. When it is determined that the error is within one step, the leg positions, namely, the positions of third piezoelectric elements 23c and 24c are reset to central positions in the range of one step of the walking operation (step S3), and a high-accuracy alignment can be achieved by the precise positioning by the expansion operations of the respective piezoelectric elements within the one step, particularly, of first piezoelectric elements 23a and 24a and second piezoelectric elements 23b and 24b (step S4). Then, it is determined whether the error relative to the target position, which is determined by the recognition means, reaches an accuracy within a target high-accuracy range or not (step S5), and when it is still not within the target range, the flow returns to step S3 and this operation for precise positioning is repeated. When the accuracy is controlled within the target high-accuracy range, the control flow finishes. By such a precise positioning, a high-accuracy alignment at a nanometer level becomes possible, which has been considered to be impossible in a conventional device.

Although the above-described embodiment has been explained with respect to a mounting apparatus for bonding wafers to each other, the alignment device according to the present invention can be applied to a mounting apparatus for bonding a wafer and a chip or a mounting apparatus for bonding chips to each other, and to a simple aligner, and further, to an exposure apparatus for performing an exposure for an object, for example, a wafer.

Figure 6:
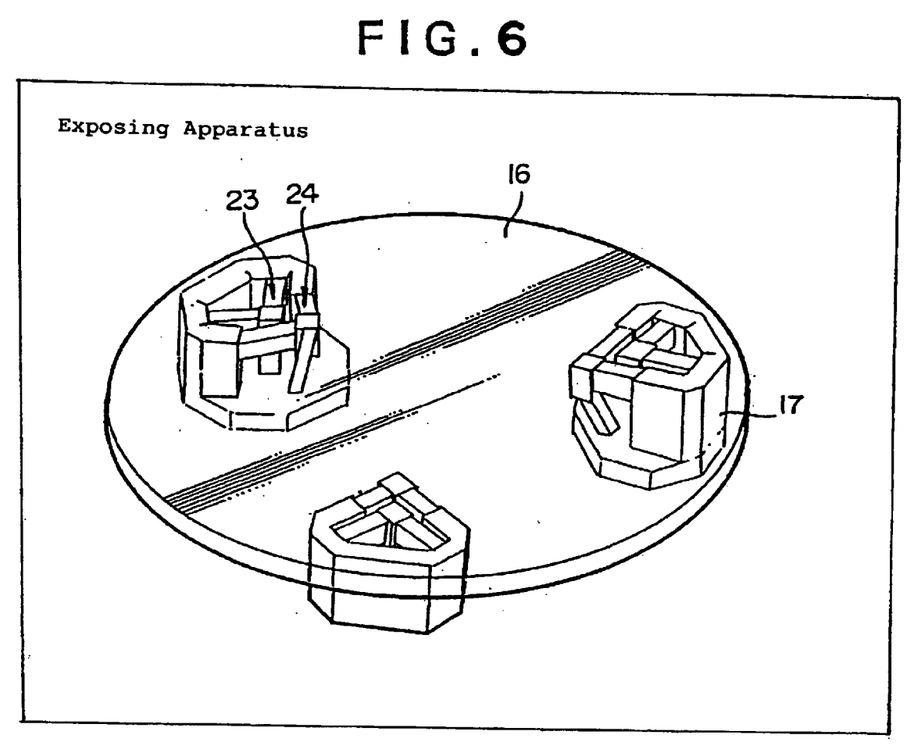
FIG. 6 is an enlarged perspective view of the alignment device portion in an exposure apparatus which is similar to the alignment device in the mounting apparatus shown in FIG. 2.

FIG. 6 shows an alignment device portion in an exposure apparatus similar to the alignment device in the mounting apparatus shown in FIG. 2. The detailed description of the operation of the alignment device will not be repeated here because it is similar to the alignment device shown in FIG. 2.

Further, although the above-described embodiment has been shown as an embodiment using a movable table, in the present invention, it is also possible to support an object to be positioned directly by the movable support means. In such a case, the aforementioned movable table 16 may be omitted and an object to be positioned may be supported by a plurality of movable support means 17. The other structures basically may be the same as those of the above-described embodiment.

INDUSTRIAL APPLICATIONS OF THE INVENTION

In the alignment device according to the present invention, it becomes possible to achieve an accuracy for alignment at a nanometer level which has not been achieved by the conventional technology. Moreover, since it is not necessary to stack position-adjusting tables, the alignment device itself, ultimately, the entire apparatus incorporating this alignment device, can be significantly reduced in thickness and size. Such an alignment device according to the present invention can be applied to any alignment apparatus requiring high-accuracy positioning of an object to be positioned within a target-accuracy range, and in particular, it is suitable for a mounting apparatus and an exposure apparatus.

What is claimed is:

1. An alignment device comprising:
   a movable table for holding an object to be positioned;
   a plurality of movable support means for movably supporting said movable table at a plurality of positions, wherein each said movable support means comprises a pair of support blocks and piezoelectric elements connected to each of said support blocks, said pair of support blocks being disposed so as to alternately contact with and separate from said movable table, said piezoelectric elements including expandable first and second piezoelectric elements that extend in a substantially horizontal direction, and an expandable third piezoelectric element that extends in a substantially vertical direction,
   said first, second and third piezoelectric elements being movable relative to said movable table so that said pair of support blocks alternately contact with and separate from said movable table, and said alignment device further including:
   recognition means for reading a recognition mark provided on at least one of the object and said movable table; and
   a control means for controlling said piezoelectric elements based on information from said recognition means, and for positioning the object within a target accuracy.

2. The alignment device according to claim 1, wherein said control means includes coarse positioning movements and precise positioning movements for positioning said movable table, wherein the coarse positioning movements are carried out by said first, second and third piezoelectric elements, and the precise positioning movements are carried out by at least one of said first and second piezoelectric elements.

3. The alignment device according to claim 2, wherein said control means further includes means for resetting said third piezoelectric element to a center position prior to the precise positioning movements.

4. The alignment device according to claim 1, wherein said control means further includes a calibration means for calibrating a property of each of said first, second and third piezoelectric elements.

5. The alignment device according to claim 1, wherein said control means includes means for controlling a walking operation including coarse positioning of the object and precise positioning of the object.

6. The alignment device according to claim 5, wherein said means for controlling a walking operation includes means for performing precise positioning of the object within a range of one step of the walking operation by an expansion operation of at least one of said piezoelectric elements.

7. The alignment device according to claim 5, wherein said control means includes means for storing a history of expansions for each of said piezoelectric elements.

8. The alignment device according to claim 7, wherein said control means includes means for resetting the history prior to the precise positioning of the object.

9. An alignment device comprising:
a plurality of movable support means for movably supporting an object to be positioned at a plurality of positions, said movable support means includes a pair of support blocks and piezoelectric elements connected to each of said support blocks, said pair of support blocks being disposed so as to alternately contact with and separate from the object, said piezoelectric elements including expandable first and second piezoelectric elements that extend in a substantially horizontal direction, and an expandable third piezoelectric element that extends in a substantially vertical direction,
said first, second and third piezoelectric elements being connected to one of said support blocks, and being movable relative to the object so that said pair of support blocks alternately contact with and separate from the object;
recognition means for reading a recognition mark provided on the object; and
a control means for controlling said piezoelectric elements based on information from said recognition means, and for positioning the object within a target accuracy.

10. The alignment device according to claim 9, wherein said control means includes coarse positioning movements and precise positioning movements for positioning the object, wherein the coarse positioning movements are carried out by said first, second and third piezoelectric elements, and the precise positioning movements are carried out by at least one of said first and second piezoelectric elements.

11. The alignment device according to claim 10, wherein said control means further includes means for resetting said third piezoelectric elements to a center position prior to the precise positioning movements.

12. The alignment device according to claim 9, wherein said control means includes means for controlling a walking operation including coarse positioning of the object and precise positioning of the object.

13. The alignment device according to claim 12, wherein said means for controlling a walking operation includes means for performing precise positioning of the object within a range of one step of the walking operation by an expansion operation of at least one of said piezoelectric elements.

14. The alignment device according to claim 9, wherein said control means includes means for storing a history of expansions for each of said piezoelectric elements.

15. The alignment device according to claim 14, wherein said control means includes means for resetting the history prior to the precise positioning of the object.

16. The alignment device according to claim 9, wherein said control means further includes a calibration means for calibrating a property of each of said first, second and third piezoelectric elements.

17. A mounting apparatus comprising:
an alignment device for positioning an object,
said alignment device positioning the object to be bonded in said mounting apparatus and said alignment device comprising:
a movable table for holding an object to be positioned;
a plurality of movable support means for movably supporting said movable table at a plurality of positions, wherein each said movable support means comprises a pair of support blocks and piezoelectric elements connected to each of said support blocks, said pair of support blocks being disposed so as to alternately contact with and separate from said movable table, said piezoelectric elements including expandable first and second piezoelectric elements that extend in a substantially horizontal direction, and an expandable third piezoelectric element that extends in a substantially vertical direction,
said first, second and third piezoelectric elements being connected to each of said support blocks, and being movable relative to said movable table so that said pair of support blocks alternately contact with and separate from said movable table, and said alignment device further including:
recognition means for reading a recognition mark provided on at least one of the object and said movable table; and
a control means for controlling said piezoelectric elements based on information from said recognition means, and for positioning the object within a target accuracy.

18. The mounting apparatus according to claim 17, wherein the object to be exposed is a wafer.

19. A mounting apparatus comprising:
an alignment device for positioning an object, said alignment device is used for positioning of the object to be bonded in said mounting apparatus and said alignment device comprising:
a plurality of movable support means for movably supporting the object to be positioned at a plurality of positions, wherein each said movable support means comprises a pair of support blocks and piezoelectric elements connected to each of said support blocks, said pair of support blocks being disposed so as to alternately contact with and separate from the object, said piezoelectric element including expandable first and second piezoelectric elements that extend in a substantially horizontal direction, and an expandable third piezoelectric element extends in a substantially vertical direction,
said first, second and third piezoelectric elements being connected to each of said support block, and being movable relative to the object so that said pair of support blocks alternately contact with and separate from the object, and said alignment device further including:
recognition means for reading a recognition mark provided on the object; and
a control means for controlling said piezoelectric elements based on information from said recognition means, and for positioning the object within a target accuracy.

20. The mounting apparatus according to claim 19, wherein the object to be exposed is a wafer.

21. An exposure apparatus comprising:

an alignment device for positioning an object, said alignment device positioning the object to be exposed in said exposure apparatus and said alignment device comprising:

a movable table for holding an object to be positioned;

a plurality of movable support means for movably supporting said movable table at a plurality of positions, wherein each said movable support means comprises a pair of support blocks and piezoelectric elements connected to each of said support blocks, said pair of support blocks being disposed so as to alternately contact with and separate from said movable table, said piezoelectric elements including expandable first and second piezoelectric elements that extend in a substantially horizontal direction, and an expandable third piezoelectric element that extends in a substantially vertical direction, said first, second and third piezoelectric elements being connected to each of said support blocks, and being movable relative to said movable table so that said pair of support blocks alternately contact with and separate from said movable table, and said alignment device further including:

recognition means for reading a recognition mark provided on at least one of the object and said movable table; and a control means for controlling said piezoelectric elements based on information from said recognition means, and for positioning the object within a target accuracy.

22. The exposure apparatus according to claim 21, wherein the object to be exposed is a wafer.

23. An exposure apparatus comprising:

an alignment device for positioning an object, said alignment device is used for positioning of the object to be exposed in said exposure apparatus and said alignment device comprising:

a plurality of movable support means for movably supporting the object to be positioned at a plurality of positions, wherein each said movable support means comprises a pair of support blocks and piezoelectric elements connected to each of said support blocks, said pair of support blocks being disposed so as to alternately contact with and separate from the object, said piezoelectric element including expandable first and second piezoelectric elements that extend in a substantially horizontal direction, and an expandable third piezoelectric element extends in a substantially vertical direction, said first, second and third piezoelectric elements being connected to each of said support block, and being movable relative to the object so that said pair of support blocks alternately contact with and separate from the object, and said alignment device further including:

recognition means for reading a recognition mark provided on the object; and a control means for controlling said piezoelectric elements based on information from said recognition means, and for positioning the object within a target accuracy.

24. The exposure apparatus according to claim 23, wherein the object to be exposed is a wafer.

* * * * *